US011812886B2

(12) United States Patent
Harrod et al.

(10) Patent No.: US 11,812,886 B2
(45) Date of Patent: Nov. 14, 2023

(54) DRIP FILTER COFFEE MACHINE

(71) Applicant: BREVILLE PTY LIMITED, Alexandria (AU)

(72) Inventors: Richard Harrod, Alexandria (AU); Alex Ming Duk Leung, Alexandria (AU)

(73) Assignee: BREVILLE PTY LIMITED, Alexandria (AU)

( * ) Notice: Subject to any disclaimer, the term of this patent is extended or adjusted under 35 U.S.C. 154(b) by 852 days.

(21) Appl. No.: 16/627,751

(22) PCT Filed: May 31, 2018

(86) PCT No.: PCT/US2018/000083
§ 371 (c)(1),
(2) Date: Dec. 30, 2019

(87) PCT Pub. No.: WO2019/000012
PCT Pub. Date: Jan. 3, 2019

(65) Prior Publication Data
US 2020/0121113 A1    Apr. 23, 2020

(51) Int. Cl.
*A47J 31/06*    (2006.01)
*A47J 31/057*    (2006.01)

(52) U.S. Cl.
CPC ......... *A47J 31/0605* (2013.01); *A47J 31/057* (2013.01); *A47J 31/0626* (2013.01)

(58) Field of Classification Search
CPC ... A47J 31/057; A47J 31/0605; A47J 31/0626
See application file for complete search history.

(56) References Cited

U.S. PATENT DOCUMENTS

| 4,191,100 A * | 3/1980 | Marotta | A47J 31/0621 99/299 |
| 4,811,657 A | 3/1989 | Rixen | |
| 5,515,771 A | 5/1996 | Smit | |

(Continued)

FOREIGN PATENT DOCUMENTS

| EP | 1 808 110 A1 | 7/2007 |
| WO | WO-2016/025992 A1 | 2/2016 |

OTHER PUBLICATIONS

Extended European Search Report for EP 18823507.1, dated Feb. 11, 2021.

(Continued)

*Primary Examiner* — Anthony J Weier
(74) *Attorney, Agent, or Firm* — Quarles & Brady LLP

(57) ABSTRACT

The technology relates to drip filter coffee machines. In one form, the coffee machine has a body extending from a base, a platform having a platform, an upward facing surface and a coupling portion, and a filter basket a downward facing bottom surface supported on the upward facing surface, a recess located in the bottom surface of the filter basket to receive the coupling portion of the platform; a downward locating feature cooperating with the platform to aid alignment of the filter basket with the platform; and wherein the upward facing surface of the platform includes an upward locating feature engaging the downward location feature to aid in locating the filter basket in an engaged position with the coupling portion.

20 Claims, 7 Drawing Sheets

(56) References Cited

U.S. PATENT DOCUMENTS

| | | | | |
|---|---|---|---|---|
| 5,880,441 | A | * | 3/1999 | Hartman .............. A47J 31/547 |
| | | | | 219/689 |
| 5,910,205 | A | * | 6/1999 | Patel .................. A47J 31/0631 |
| | | | | 99/323 |
| 5,957,036 | A | * | 9/1999 | Warner ................ A47J 31/061 |
| | | | | 99/279 |
| 8,850,958 | B2 | | 10/2014 | McCormick et al. |
| 2007/0017381 | A1 | | 1/2007 | Takizawa et al. |
| 2011/0081466 | A1 | * | 4/2011 | Lassota .............. A47J 31/0615 |
| | | | | 99/283 |
| 2014/0165848 | A1 | | 6/2014 | Sachtleben |
| 2018/0263405 | A1 | * | 9/2018 | Drees .................... A23F 5/262 |

OTHER PUBLICATIONS

International Search Report and Written Opinion for PCT/AU2018/000083, dated Aug. 17, 2018.

* cited by examiner

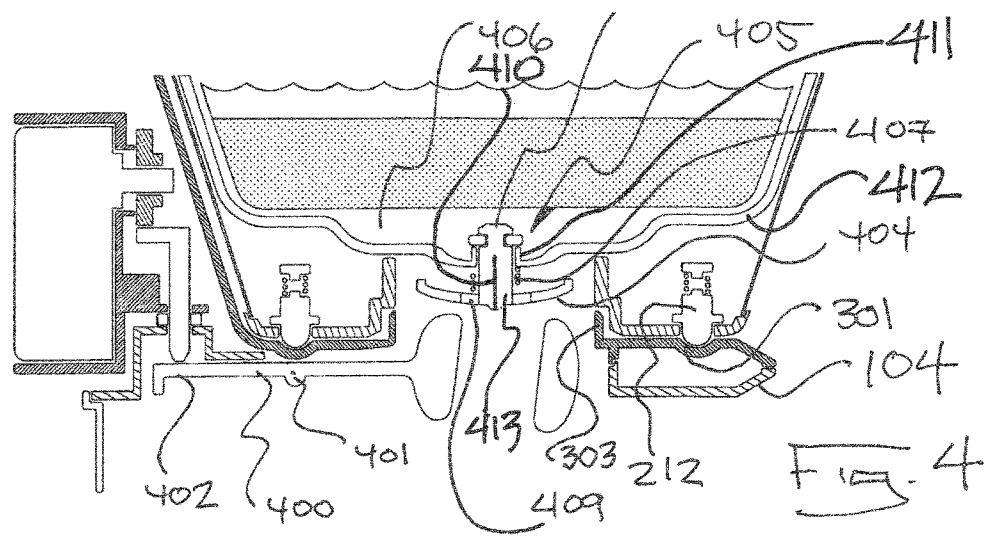
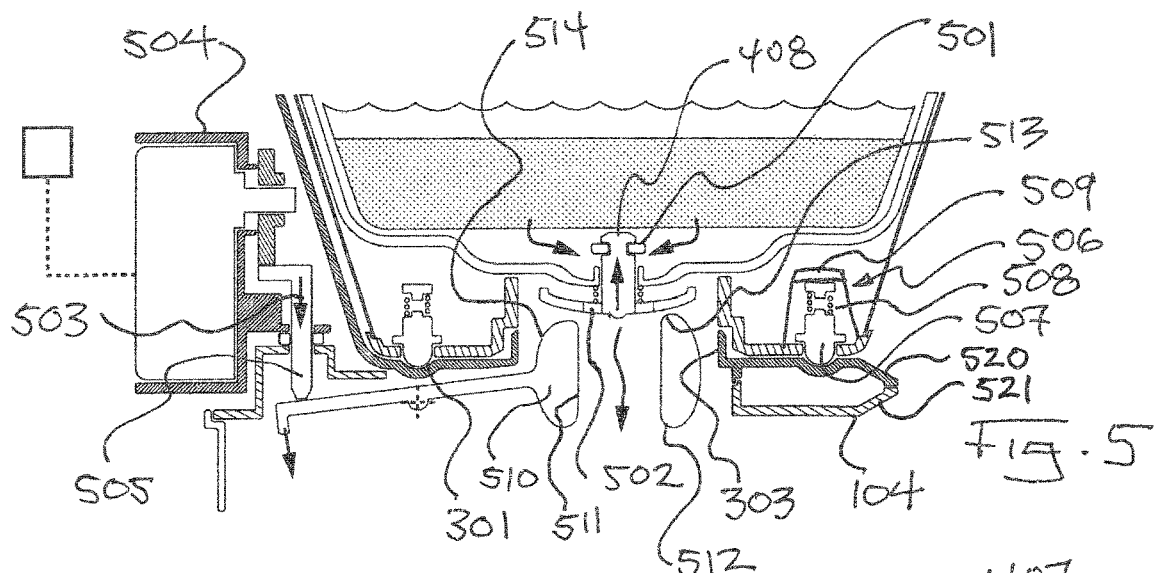
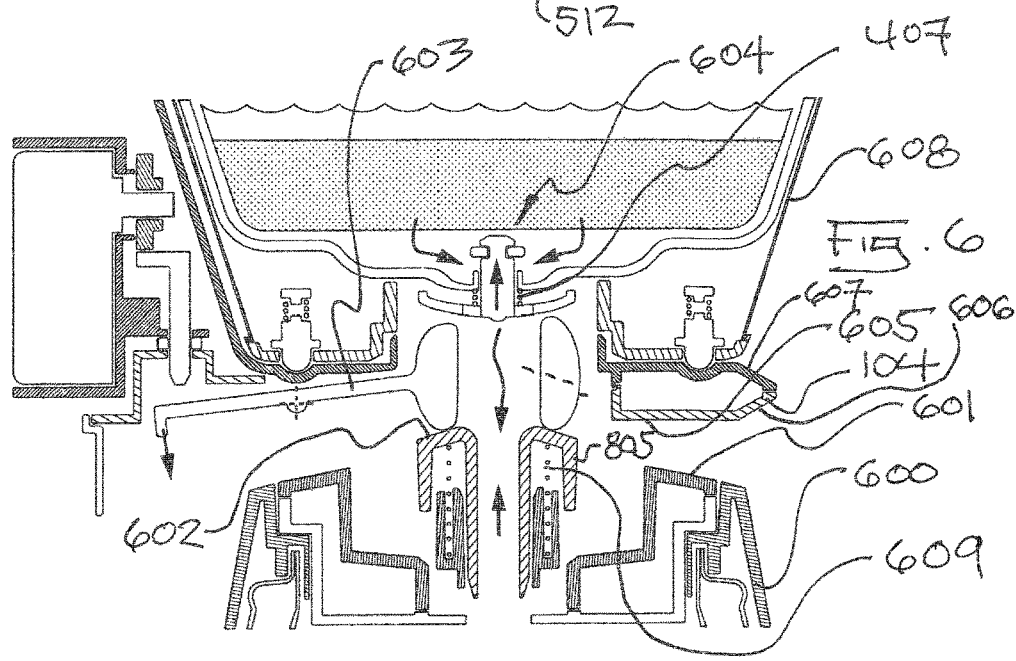

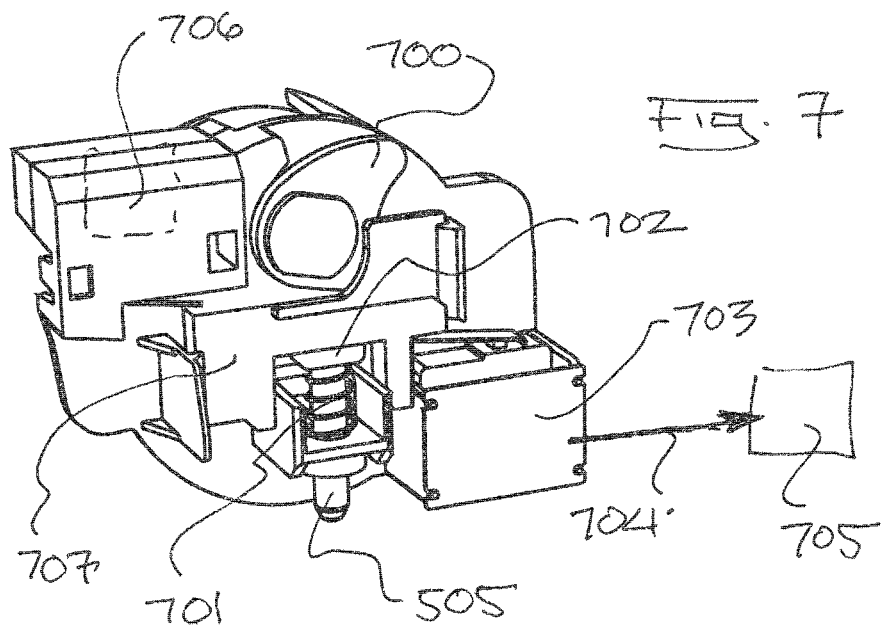
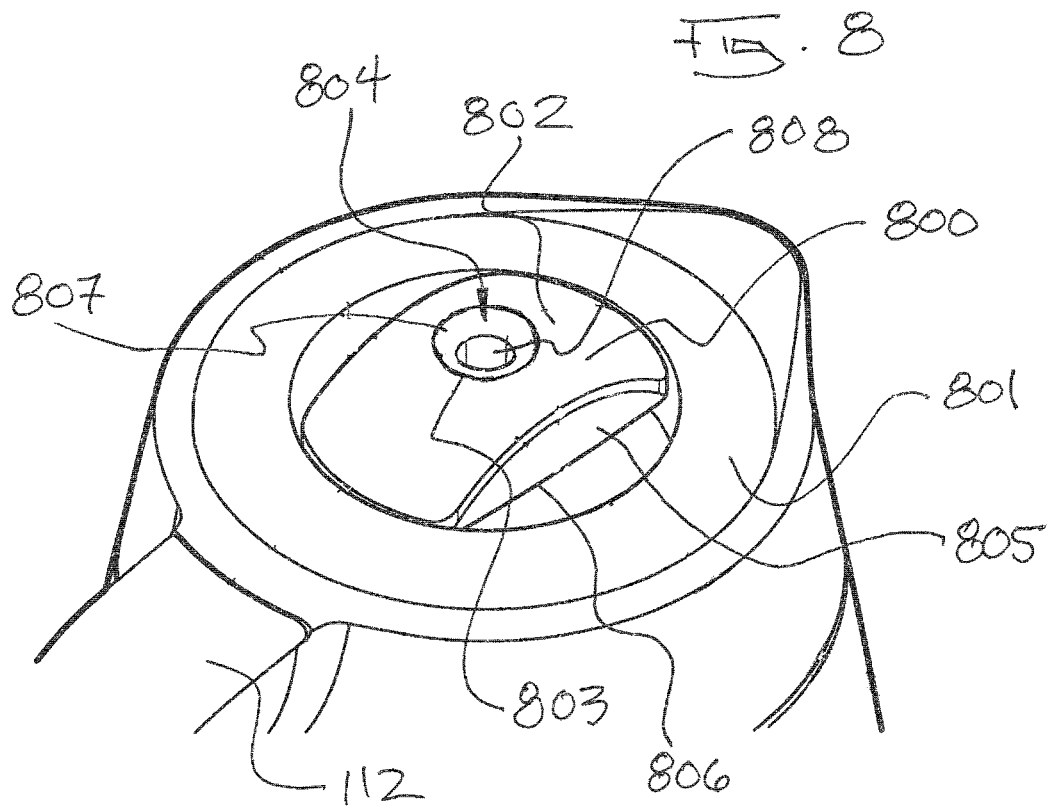

DRIP FILTER COFFEE MACHINE

FIELD

The technology relates to drip filter coffee machines and more particularly to the interconnection between a filter basket, its receptacle and the vessel into which it dispenses.

BACKGROUND

A drip filter coffee machine has a filter basket. The filter basket is constructed to contain a filter that separates coffee being brewed in it from the basket's discharge opening. Devices that use paper filters are well known. In popular configurations, the filter basket discharges into a carafe. It is a significant advantage to eliminate unwanted or unnecessary discharge from the filter basket (leakage). Unless the carafe is well aligned to receive the output of the filter basket, any output from the filter basket is undesirable. The problem is exacerbated when, as is the case, the acceptable range of misalignment between the filter basket and the carafe is small.

Some carafes, particularly insulated carafes have a relatively small inlet opening. A smaller inlet opening allows for more insulation in the lid of the carafe. The prior art is known to contain carafes with insulated lids and small inlet openings that cooperate with a drip stop valve that regulates the output of a filter basket. Such arrangements effectively prevent unwanted discharge and dripping and also provide for a well-insulated carafe in which beverages stay hotter longer.

However, in machines of that type, it is usually required that the filter basket (and sometimes the carafe) be aligned with one another and aligned with the machine that supports them in a particular and limited range of orientations.

Because both the filter basket and carafe usually have handles, common orientations involve one or both handles facing forward, or alternately, to one side or the other.

Consumers of such devices would prefer not to be constrained in the way that the filter basket and the carafe need to be aligned during use.

Filter baskets are known to have drip stop valves. The discharge valve selectively controls the flow of brewed coffee out of the filter basket. Conventionally, the drip stop valve is biased into a closed position and must be actuated in order to permit flow out of the filter basket. Manual and electromechanical activation of the discharge valve is known. However, because the mechanical drip stop valve actuator is physically close to the outlet of the filter basket, coffee being discharged may wick or otherwise accumulate on it. Such leaking and accumulating is somewhat inevitable, but can be managed.

Efficient cooperation between an actuator and a discharge valve of a filter basket requires a special relationship between the parts.

Because it is preferred that the actuator be operated by a carafe being inserted beneath it and because the carafe's actuator contacting surface may be spring biased upward, the opposing spring forces of the drip stop valve and carafe must be configured to cooperate.

SUMMARY OF INVENTION

The technology provides for a mechanical coupling between a filter basket and a carafe.

In some embodiments, the technology provides for a drip filter coffee machine having a filter basket supporting platform. The platform cooperates in the coupling between the filter basket and optionally, the carafe.

The technology provides a drip filter coffee machine, the filter of which has a drip stop valve. Both the filter basket and the carafe may be inserted for use, without regard to the handle orientation of either.

The technology provides, in drip filter coffee machines having a filter basket receiving platform, and an upright rim that cooperates with the underside of the filter basket. In some embodiments, the filter basket, and a part of the platform interlock.

In other embodiments of the technology, the underside of the filter basket has a wide tapered pilot that leads to a receiving opening that surrounds a central outlet of the filter basket.

In further embodiments, the drip stop valve has a central outlet that creates a centralised flow.

In other embodiments, an actuator is a torus having a central opening with cylindrical sidewalls. In some embodiments, the upper and lower edges of the cylindrical sidewall are sharply radiused.

In some other embodiments of the technology, an underside of the filter basket carries locators that are captured within a circular track formed on an upper surface of a filter basket supporting platform.

The technology also provides a carafe having a valve activating surface that is biased upward for the purpose of entering a recess area above a lower surface of a filter basket supporting platform. The contacting surface interacts with an actuator.

The actuator interacts with the basket's drip stop valve. The discharge valve has a central opening that discharges through the actuator and into an aligned opening in the contact surface. Thus, the flow of liquid out of the filter basket and into the carafe below it is from the centre line of the filter basket, through the centre of the actuator and through the centre of the opening in the contact surface.

In preferred embodiments of the technology, the contact surface, in the area of its inlet, comprises a spherical major surface in which is formed the inlet opening. There is a funnel-like transition between the spherical surface and the opening. Preferably, the transition between the spherical surface and the opening lacks a distinct edge.

BRIEF DESCRIPTION OF DRAWINGS

In order that the invention be better understood, reference is now made to the following drawing figures in which:

FIG. 4 is a cross-sectional view through a filter basket, platform and actuator.

FIG. 5 is a cross-sectional view through a filter basket, platform and actuator.

FIG. 6 is a cross-sectional view through a filter basket, platform and actuator.

FIG. 7 a perspective view of a motorised cam.

FIG. 8 is a perspective view of a carafe and lid.

DESCRIPTION OF EMBODIMENTS

Figure 1:
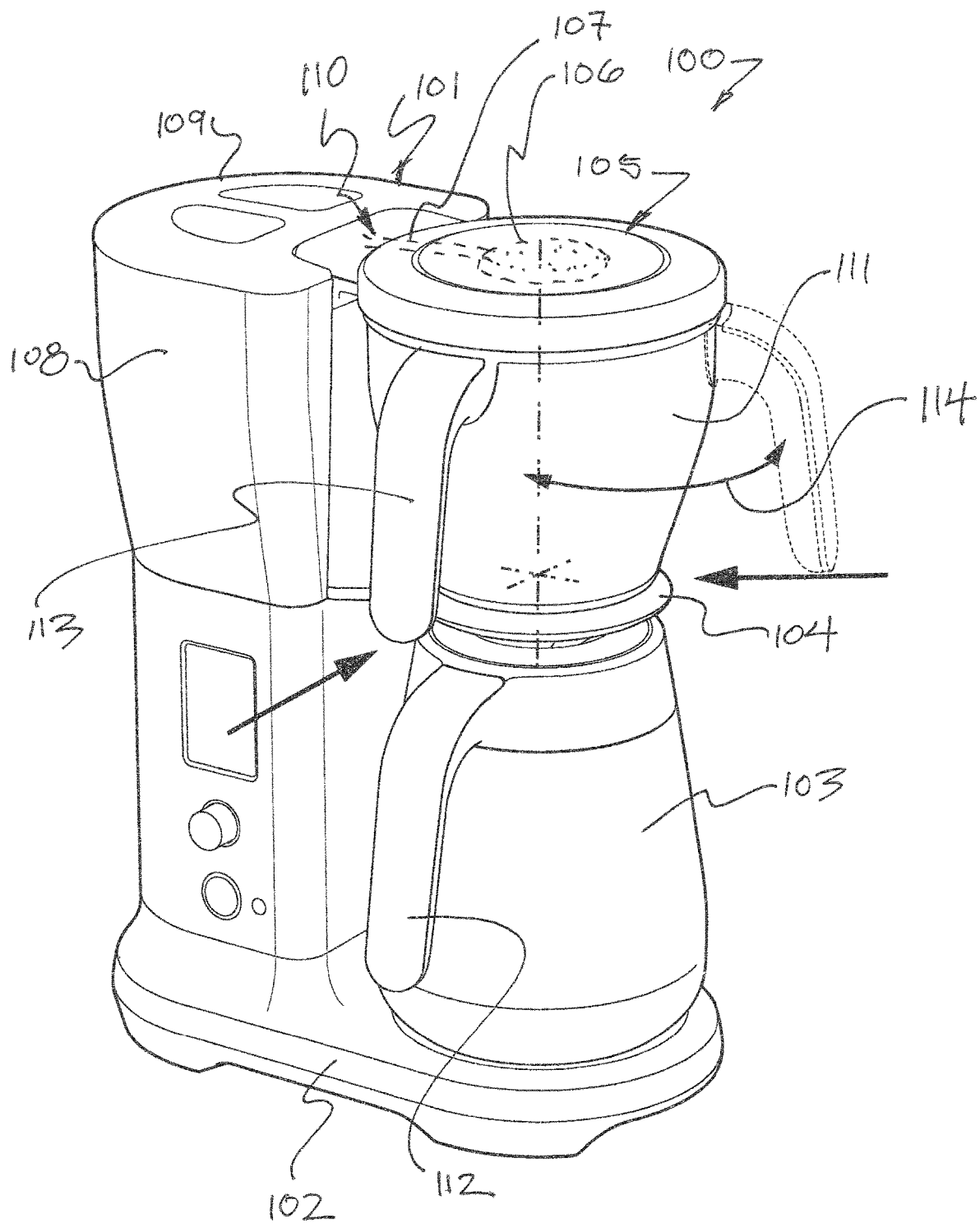
FIG. 1 is a perspective view of a drip filter coffee machine.

As shown in FIG. 1, a drip filter coffee machine 100 has a main body 101.

The main body 101 has a base 102 that is adapted to receive a carafe 103. The carafe 103 is insertable and removable below a fixed platform 104 that forms part of the main body 101.

The main body 101 may support a pivoting or preferably, a fixed lid 105. In some embodiments, the lid may have an internal water discharge head 106 that cooperates with a supply line 107 that carries heated water from within the main body 101. In some embodiments, vertical height of the main body's water reservoir and the upper surface of the lid 105 are all the same. In other embodiments, the discharge head is carried by the main body 101, not the lid.

When the lid 105 or discharge head 106 is in place, the filter basket 111 can be removed from the platform 104.

Both the carafe 103 and the filter basket 111 have handles 112, 113. In the example of FIG. 1, the carafe's handle 112, during insertion, use and removal, may be situated in any angular orientation that is not prohibited by the main body 101. This represents an angular travel or sweep of about 270 degrees. The technology described herein will show how a filter basket with a drip stop valve can also be inserted so as to cooperate with the carafe, over a range of angular orientations (of 20 about 270 degrees) 114, that is, only practically limited by the presence of the main body 101 or other obstructions (like a user's hand).

Figure 2:
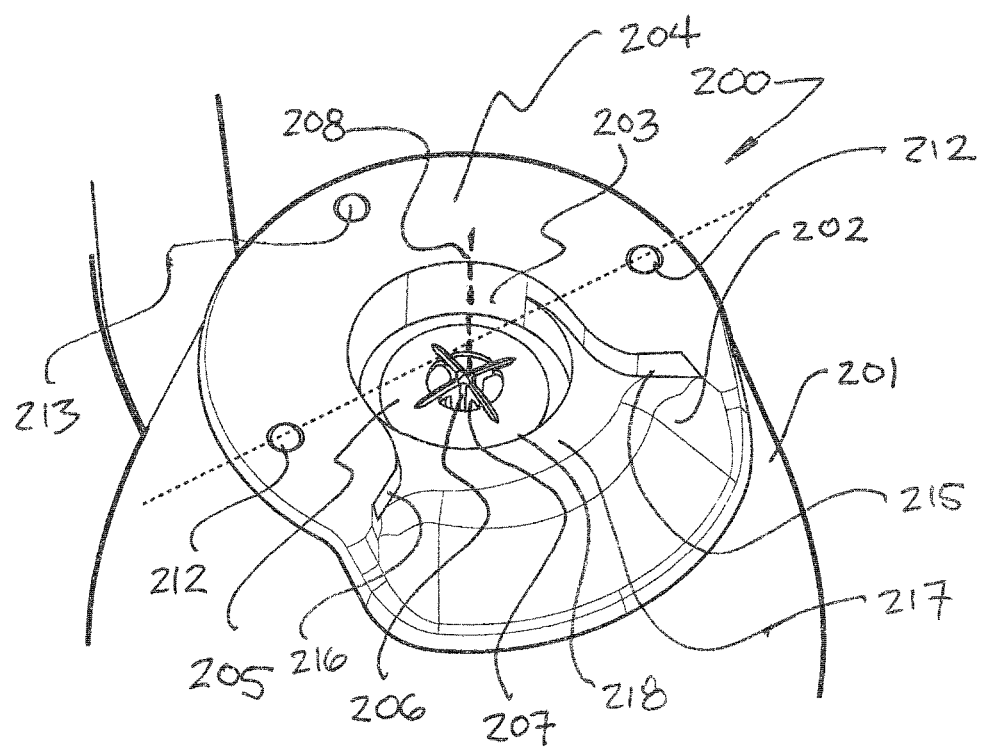
FIG. 2 is a perspective view of an underside of a filter basket showing a guide or pilot.
Figure 3:
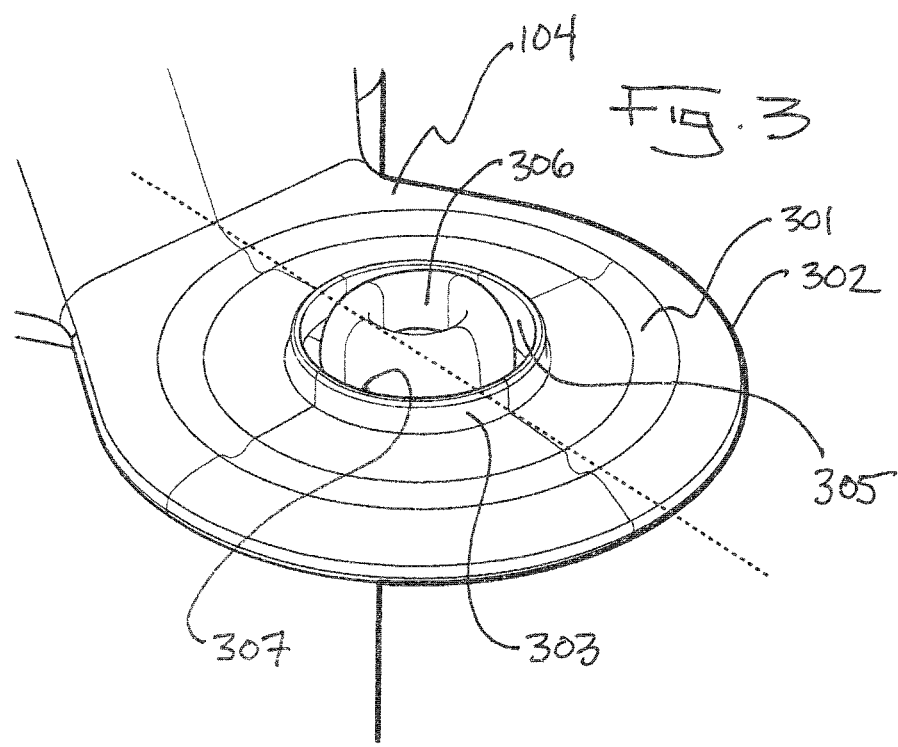
FIG. 3 is a perspective view of a platform of a coffee making machine.

As shown in FIGS. 2 and 3, the underside 200 of the filter basket 201 has a recess 202 forming a ramp or tapered pilot into a central bore 203. The recess 202 includes a flat or horizontal guide surface 217 that defines one edge 218 of the bore 203. The flat guide surface 217 is intended to contact the upper rim 307 of the coupling 303, and the ramp 202 is intended to contact the tapered or chamfered edge 302 of the platform's upper rim 302. The sidewalls 215, 216 of the ramp taper or narrow toward the bore 203 and guide the coupling 303 into position. The lower or contacting surface 205 of the filter basket's discharge or drip stop valve is located within the bore 203. The valve surface 205 is preferably a section of a sphere or otherwise smoothly curved. The surface 205 has a central opening 206 through which brewed coffee is discharged out of the filter basket 201. In this example, the discharged stream of coffee is centralised and regularised by way of an array of fins 207 that intersect along a common axis 208 that is central to the fins 207. The discharge flow forms around and along this axis 208.

The lower most surface 204 of the filter basket may include an array of locating features 212. In this example, each locating feature is a protruding spheroidal or rounded tip 213. The tip 213 may be retractable. In this example, the features 212 are three in number and located around a common radius from the axis 208. All three features 212 engage and cooperate with features on the upper surface of the platform 104.

As shown in FIG. 3, the platform 104 has an upper surface 300 in which is formed a circumferential groove 301. The platform's upper rim 302 is radiused or tapered to lead into the groove 301. The lower part of the rim may also be tapered. A raised male coupling portion or rim 303 is raised above the level of the groove enough to be engaged circumferentially and located by the bore 203 in the underside of the filter basket when the outer part of the coupling portion 303 contacts or is stopped by the bore 203. This happens as the filter basket is inserted.

The male coupling feature 303 has a central through opening 305 that receives the upper part of the drip stop valve's actuator 306. When the actuator 306 is elevated, it acts against the contact surface 205 of the drip stop valve, allowing fluid to flow through it.

As shown in FIG. 4, the actuator 400 is supported for pivoting motion around a retaining pin 401. Depressing the distal end 402 of the actuator causes it to pivot and contact the underside 403 of the basket's discharge valve 405. The discharge valve 405 is located at the lowest point of the basket's internal filter chamber 406. The valve 405 is biased downward (toward the actuator) by a spring 407. When the moving valve element 408 is lifted by the actuator, brewed coffee flows past the small valve stem or shaft 410 and through a central discharge opening 409 in the actuator. The shaft 410 is supported for sliding in the larger opening 411 in the filter basket compartment 412 by an array of radial fins 413.

As shown in FIG. 5, lifting of the valve body 408 unseats a seal 501 that admits brewed coffee into the openings 502 in the valve body. In this example, the lifting power is provided by the linear motion 503 of a tab or mechanical finger 505. The finger 505 may be driven by a motorised cam 504 as shown in FIG. 7, or otherwise.

FIG. 5 also illustrates that the protruding locating features 506 may have tips 507 that are biased into position by a compression spring 508 captured between the tip 507 and a portion of the filter basket 509. Also illustrated are the chamfers, taper or curvature of the upper and lower edges 520, 521 that surround the platform 104, where it contacts the filter basket, on insertion.

As shown in FIGS. 4, 5 and 6, the working head of the actuator 510 comprises a toroidal or donut-like structure having a central passageway 511. The passageway 511 is either generally cylindrical or tapered toward a wider opening at the discharge end of the passageway 511. The upper and lower ends of the passageway 511 are sharply radiused 512, 513 and more sharply radiused than the remainder of the exterior 514 of the head 510. This acts to collect and manage leakage. The diameter of the upper extent of passageway 511 is slightly offset and wider than the discharge passageway 502. This takes into account the motion of the actuator and minimizes the possibility of the discharge stream taking a path over the exterior 514. The parallel or cylindrical walls of the passageway 511 together with the radiused edges 512, 513 minimise the accumulation of fluid on the head 510, particularly in the central flow path.

The radius 512 is smooth enough to make acceptable sliding engagement with the contact surface 802 of the carafe that drives it into engagement with the drip stop valve. Similarly, the upper edge 513 of the head is smooth enough to make sliding engagement with the under surface 404 of the drip stop valve 405 and pilot 202.

As shown in FIG. 6, an insulated carafe 600 has an insulted lid 601. The lid has a spring biased contact surface 602 that is able to drive the actuator 603 into the drip stop valve 604. In preferred embodiments, it is desirable to have the upper or extended position of the contacting surface 602 terminate at a vertical height that is higher than the underside surface 605 of the fixed platform 104. The biased contacting surface 602 reciprocates to better pass below the platform 104 and then extend upwards into the through opening 305 to contact head 510. The underside front edge 606 of the platform is chamfered to guide the contacting surface 602.

In order to both pass under the platform 104 and ultimately achieve a location above the lower surface of it 605, the lids contacting surface 602 is biased upward by a second compression spring 609. The spring force of the second spring 609 must be enough to overcome the spring force of the spring 407 that maintains the closure of the drip stop valve 604. However, it must not be so strong as to interfere with the insertion of the carafe into its fill position.

As shown in FIG. 7, the finger 505 that drives that actuator 400 may be driven or propelled by a motorised, rotating cam 700. The finger 505 is trapped for reciprocal motion and biased away from its extended position by a compression spring 701. In preferred embodiments, the head 702 of the finger 701 or the cam itself 700 interacts with a switch 703 or sensor that transmits a signal 704 to the device's processor 705. The switch or sensor 703 provides information to the processor about the location of the actuator. The processor 705 also controls the motion of the cam 700 by transmitting power signals to an electric motor 706 located within the housing 707 that supports the cam 700, the finger 500 and optionally, the switch or sensor 703.

As shown in FIG. 8, the contacting surface 800 of the carafe's lid 801 has a spherical or otherwise curved upper surface 802. The entire surface 802 drops away from a high point represented by an imaginary diameter 803 that encircles an inlet opening 804. In this example, the contact bumper 800 has parallel sidewalls 805 that allow it to reliably reciprocate with a flat-sided slot 806 formed in the lid. The sidewalls 805 also conceal the second spring 609 from sight.

The inlet opening 804 consists of a radius or smoothly curved funnel 807. The funnel 807 falls away from the diameter 803 and blends into a centrally located, straight vertical passageway 808 that leads into the interior of the carafe. The spherical or curved configuration of the upper surface 802 allows the carafe to be inserted into engagement with the actuator 400 in any angular orientation of the carafe's handle 112 with respect to the main body 101.

Figure 9:
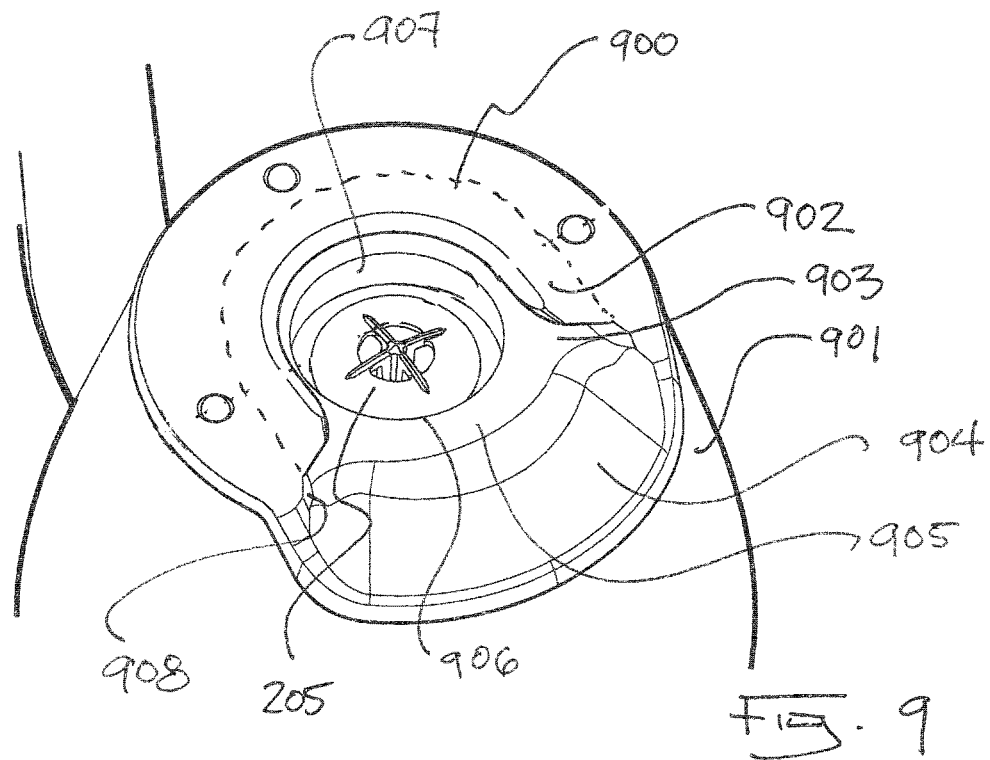
FIG. 9 is an underside perspective view of a filter basket and drip stop valve.
Figure 10:
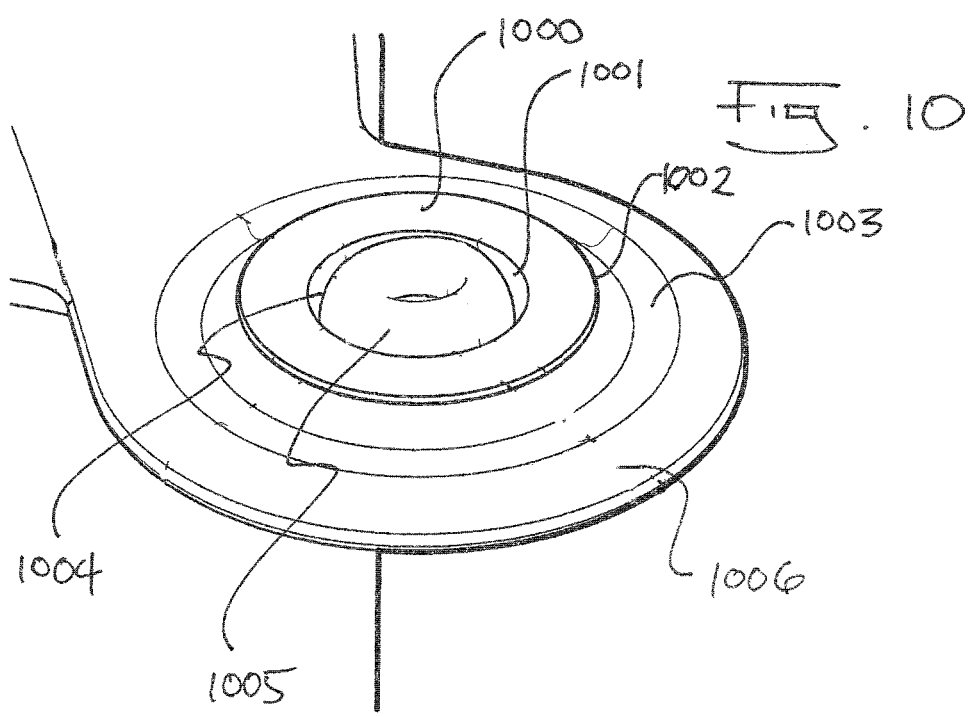
FIG. 10 is a perspective view of a platform and actuator.

FIGS. 9 and 10 illustrate an alternate embodiment of an engagement between a platform 104 and a filter basket 901. In the example shown in FIGS. 2 and 3, in addition to the lid there is no mechanical engagement or interference between the filter basket and the platform that would inhibit unwanted vertical motion of the filter basket once it is in place. In the examples of FIGS. 9 and 10, the underside 900 of the filter basket 901 has a lip or overhang 902 that creates a partially circumferentially slot 903. The slot 903 created by the overhang 902 receives a circular head 1000. As shown in FIG. 10, the head 1000 is elevated above the upper surface of the platform by a cylindrical neck 1001 and may be removable. The outer rim 1002 is radially inward of the circumferential groove 1003. The head 1000 has a central opening 1004 through which the drip stop valve actuator 1005 can be brought into and out of engagement with the contact surface of the drip stop valve 205.

The ramp 904 leads to a flat guide portion 905 that is flush with the rim 906 of the bore 907. This pilot area may include lateral narrowing guide surfaces 908 for directing the outer rim 1002 into the slot 903. When coupled, the peripheral wall of the slot 903 receives and may contact the rim 1002. As with the embodiments in FIGS. 2 and 3, the ramp surface 904 cooperates with the tapered or chamfered edge 1006 of the platform, and the flat guide portion 905 cooperates with the upward facing surface of head 1000.

Figure 11:
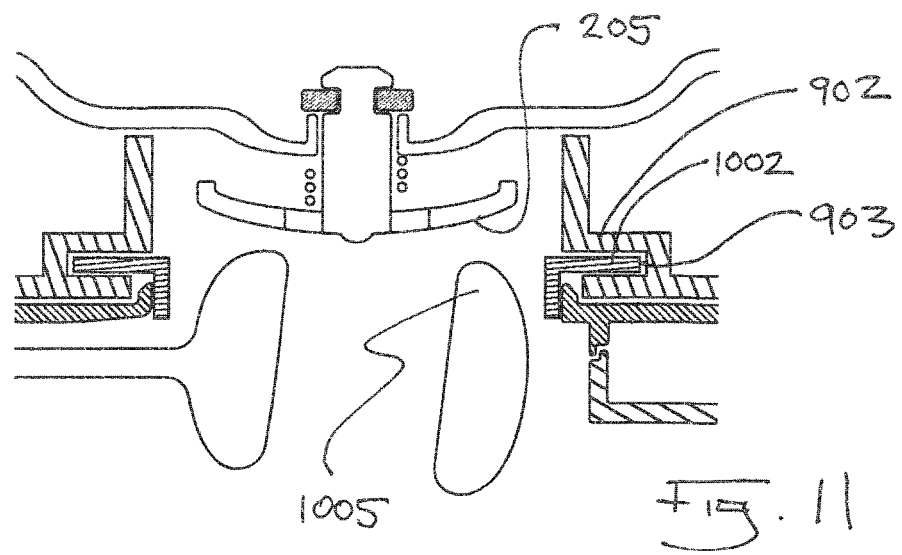
FIG. 11 is a cross sectional view of an interlocking of a filter basket with a platform under which is an actuator.

As shown in FIG. 11, the rim 1002 of the male coupling feature is seen as carried by the slot 903 formed by the overhanging rim 902 shown in FIGS. 9 and 10.

Figure 12:
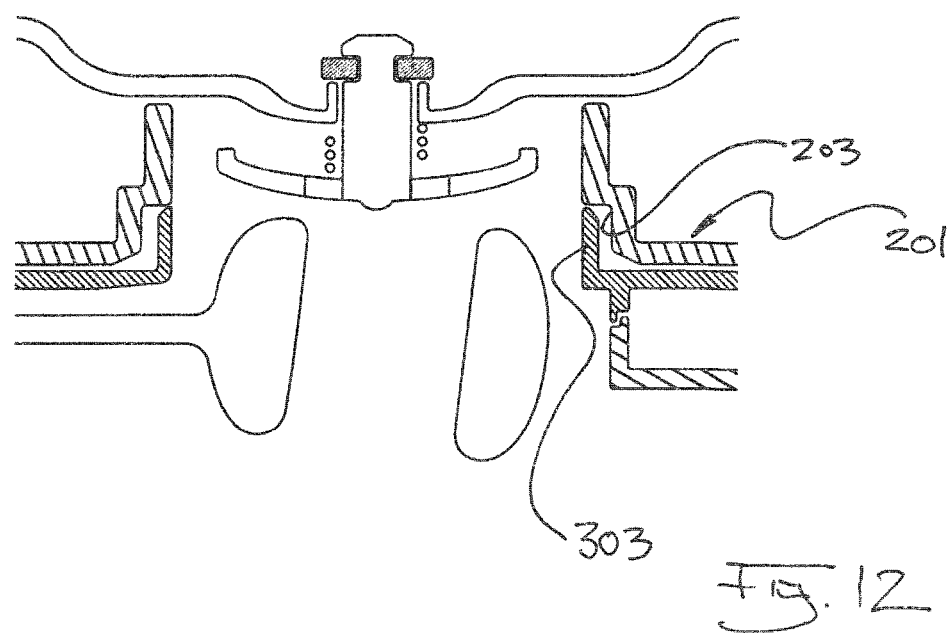
FIG. 12 is a cross sectional view of a platform and filter basket.

FIG. 12 illustrates the alternate arrangement of FIGS. 2 and 3 where the upright cylindrical coupling feature 303 is nested within the bore 203 on the underside of the filter basket 201 as suggested by FIGS. 2 and 3.

Figure 13:
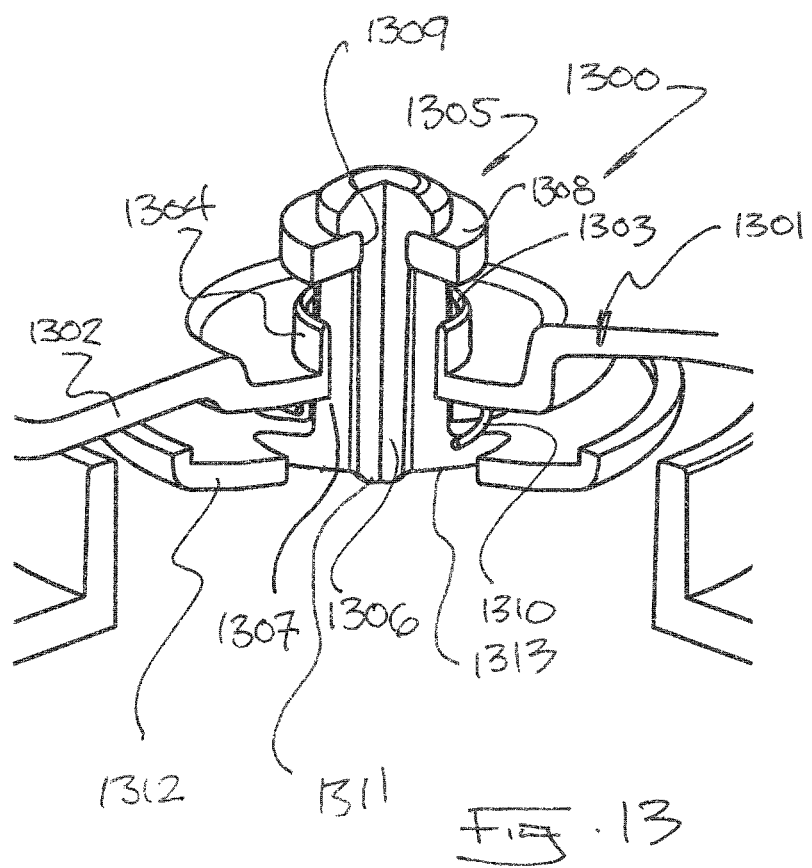
FIG. 13 is a perspective view, partially sectioned, of a drip stop valve.

FIG. 13 illustrate a drip stop valve 1300 for a filter basket 1301. In this embodiment, the underside 1302 of the filter basket has a central opening 1304 surrounded by an elevated sealing rim 1303. The reciprocating sealing element 1305 has a small central shaft 1306 that supports an array of (in this example) four spacer fins 1307. The fins 1307 guide the element 1305 for motion within the rim 1303. The fins also increase the surface area in the central flow region to encourage wicking close to the shaft 1306. The lower edges of the fins 1313 may be tapered. Lower ends of the fins 1307 affix the valve's circular contact surface 1308 to the shaft 1306. An upper head of the shaft 1306 has a circumferential groove 1309 that carries a polymeric seal 1308. The lowest tip 1311 of the shaft 1306 protrudes from an underside of the valve element 1312 to form a wick and define a central wicking axis. The sealing element 1305 is biased downward (toward the actuator) by a compression spring 1310 carried between the contacting surface 1308 and the underside of the filter compartment 1302. Unless acted on by an actuator or a vessel, the spring 1310 drives the seal 1308 into engagement with the sealing rim 1303. When the reciprocating valve element 132 is lifted, liquid flows though over the rim 1303 forming separate flow regions that recombine into a single stream once the liquid flows past the fins 1307.

Although the invention has been described with reference to specific examples, it will be appreciated by those skilled in the art that the invention may be embodied in many other forms.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Reference throughout this specification to "one embodiment" or "an embodiment" or "example" means that a particular feature, structure or characteristic described in connection with the embodiment is included in at least one embodiment of the present invention. Thus, appearances of the phrases "in one embodiment" or "in an example" in various places throughout this specification are not necessarily all referring to the same embodiment or example, but may. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Any claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Thus, while there has been described what are believed to be the preferred embodiments of the invention, those skilled in the art will recognize that other and further modifications may be made thereto without departing from the scope of the invention, and it is intended to claim all such changes and modifications as fall within the scope of the invention.

While the present invention has been disclosed with reference to particular details of construction, these should be understood as having been provided by way of example and not as limitations to the scope of the invention.

The invention claimed is:

1. A coffee machine having a base, a body extending upwardly from the base, a platform having an upward facing surface and a coupling portion, the platform being supported by and extending outwardly from the body, and a filter basket, wherein the filter basket comprises:
   a downward facing bottom surface supported on the upward facing surface, a recess located in the bottom surface of the filter basket to receive the coupling portion of the platform;
   at least one downwardly facing locating feature cooperating with the platform to aid alignment of the filter basket with the platform, the downwardly facing locating feature being retractable into the bottom surface and biased to protrude from the bottom surface;
   wherein the upward facing surface of the platform includes at least one upwardly facing locating feature for engagement with the downwardly facing locating feature to at least aid in locating the filter basket in an engaged position with the coupling portion, and
   wherein the filter basket is insertable into the engaged position over a range of angular orientations.

2. The coffee machine of claim 1, wherein the downward facing bottom surface of the filter basket has two guide surfaces that taper toward the recess to guide the filter basket into the engaged position with the platform.

3. The coffee machine of claim 2, further including a generally upright axis passing through a central portion of the coupling portion with the coupling portion of the platform aligned on the axis and with the recess when the locating features are engaged.

4. The coffee machine of claim 3, wherein the coupling portion has a rim extending upwardly from the platform that contacts at least one of the two guide surfaces during engagement of the filter basket with the platform.

5. The coffee machine of claim 4, wherein the filter basket is locatable in the engaged position by moving the filter basket toward the generally upright axis from a radial angle of at least 90 degrees relative to the generally upright axis.

6. The coffee machine of claim 1, wherein the filter basket further includes:
   a valve selectively operable to allow liquid coffee to exit the filter basket; and
   the platform including a lever, said lever having a central passageway; and wherein
   the lever is operable to open the valve to allow liquid coffee to exit from the filter basket through the central passageway of the lever.

7. The coffee machine of claim 6, wherein the valve has a central pin, the pin having a fin-like structure, to encourage wicking of the liquid coffee, as the liquid coffee passes through the valve and through the central passageway of the lever.

8. The coffee machine of claim 7, wherein the lever has a proximal end and a distal end relative to the coffee machine, the proximal end having a point of rotation and the distal end having a toroidal shaped head surrounding the central passageway to allow liquid coffee to pass through the central passageway of the lever.

9. The coffee machine of claim 6, wherein, the upwardly forced portion of the lid reciprocates downwardly under interference with the platform and upwardly once the carafe is in an engaged position relative to the platform.

10. The coffee machine of claim 1, wherein the filter basket further includes:
    an opening for a discharge flow of coffee from the filter basket, the opening having an array of fins that intersect along a common axis such that the discharge flow of coffee forms around and along the common axis.

11. The coffee machine of claim 10, wherein the common axis is central to the opening.

12. The coffee machine of claim 10, wherein the common axis is central to the opening.

13. The coffee machine of claim 1, wherein the at least one locating feature is an array of locating features for simultaneous cooperation with the platform to aid alignment of the filter basket with the platform.

14. The coffee machine of claim 13, wherein the array of locating features are protrusions from the bottom surface of the filter basket, and the upwardly facing surface has a groove to receive the protrusions.

15. The coffee machine of claim 14, wherein the protrusions are retractable into the bottom surface and biased to protrude from the bottom surface.

16. The coffee machine of claim 14, wherein the groove is circular.

17. The coffee machine according to claim 14, wherein the filter basket further includes an opening for a discharge flow of coffee out of the filter basket, the opening having an axis such that the discharge flow forms around and along the axis, and the protrusions are positioned at a common radius from the axis.

18. The coffee machine of claim 17, wherein the groove in the upward facing surface and the array of protrusions are concentric with the axis of the discharge flow when the filter basket is supported on the platform.

19. The coffee machine according to claim 14, wherein the protrusions have a spherical or rounded tip.

20. The coffee machine of claim 4, wherein the rim of the coupling portion engages a wall of the recess of the filter basket when the filter basket is located in the engaged position.

* * * * *

UNITED STATES PATENT AND TRADEMARK OFFICE
CERTIFICATE OF CORRECTION

PATENT NO. : 11,812,886 B2
APPLICATION NO. : 16/627751
DATED : November 14, 2023
INVENTOR(S) : Richard Harrod et al.

Page 1 of 1

It is certified that error appears in the above-identified patent and that said Letters Patent is hereby corrected as shown below:

On the Title Page

Insert Item (30), --(30) Foreign Application Priority Data June 30, 2017 (AU) 2017902537--.

Item (86) PCT No.:, "PCT/US2018/000083" should be --PCT/AU2018/000083--.

Signed and Sealed this
Thirtieth Day of January, 2024

Katherine Kelly Vidal
*Director of the United States Patent and Trademark Office*